US010229941B2

(12) United States Patent
Oike et al.

(10) Patent No.: US 10,229,941 B2
(45) Date of Patent: Mar. 12, 2019

(54) SOLID-STATE IMAGING ELEMENT, DRIVING METHOD, AND ELECTRONIC APPARATUS

(71) Applicant: SONY SEMICONDUCTOR SOLUTIONS CORPORATION, Kanagawa (JP)

(72) Inventors: Yusuke Oike, Kanagawa (JP); Takashi Machida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 443 days.

(21) Appl. No.: 14/300,989

(22) Filed: Jun. 10, 2014

(65) Prior Publication Data

US 2014/0319323 A1 Oct. 30, 2014

Related U.S. Application Data

(63) Continuation of application No. 13/312,478, filed on Dec. 6, 2011, now Pat. No. 8,884,206.

(30) Foreign Application Priority Data

Dec. 15, 2010 (JP) ................................ 2010-279508

(51) Int. Cl.
*H01L 27/146* (2006.01)
*H01L 27/148* (2006.01)

(52) U.S. Cl.
CPC ...... *H01L 27/14603* (2013.01); *H01L 27/148* (2013.01); *H01L 27/14609* (2013.01); *H01L 27/14623* (2013.01); *H01L 27/14625* (2013.01)

(58) Field of Classification Search
CPC ......... H01L 27/14603; H01L 27/14609; H01L 27/14623; H01L 27/14625; H01L 27/148;
(Continued)

(56) References Cited

U.S. PATENT DOCUMENTS 5,847,381 A 12/1998 Isogai
6,498,622 B1 * 12/2002 Nakashiba ........ H01L 27/14609 257/435

(Continued)

FOREIGN PATENT DOCUMENTS

JP 10-313426 11/1998
JP 2000-077642 3/2000

(Continued)

OTHER PUBLICATIONS

Japanese Office Action issued in connection with related Japanese patent application No. 2010-279508 dated Jun. 5, 2014.

*Primary Examiner* — Georgia Y Epps
*Assistant Examiner* — Don Williams
(74) *Attorney, Agent, or Firm* — Chip Law Group

(57) ABSTRACT

A solid-state imaging element including: a plurality of unit pixels each having a photoelectric conversion part, a transfer part that transfers a charge generated by the photoelectric conversion part to a predetermined region, and a draining part that drains a charge in the predetermined region; a light shielding film being formed under an interconnect layer in the unit pixels and shield, from light, substantially the whole surface of the plurality of unit pixels except a light receiving part of the photoelectric conversion part; and a voltage controller controlling a voltage applied to the light shielding film. The voltage controller sets the voltage applied to the light shielding film to a first voltage in charge draining by the draining part and sets the voltage applied to the light (Continued)

shielding film to a second voltage higher than the first voltage in charge transfer by the transfer part.

20 Claims, 14 Drawing Sheets

(58) Field of Classification Search
CPC ............. H01L 27/146; H01L 27/14607; H01L 27/1463; H01L 27/14636
USPC ....... 250/208.1, 214 R, 214.1; 348/294–312; 257/294, 431–437
See application file for complete search history.

(56) References Cited

U.S. PATENT DOCUMENTS

| | | | | |
|---|---|---|---|---|
| 2007/0205354 | A1* | 9/2007 | Li | H01L 27/14623 250/208.1 |
| 2008/0055449 | A1* | 3/2008 | Nagase | H01L 27/14818 348/311 |
| 2010/0001178 | A1* | 1/2010 | Koshiba | H04N 5/3655 250/237 R |

FOREIGN PATENT DOCUMENTS

| | | |
|---|---|---|
| JP | 2003-258234 | 9/2003 |
| JP | 2005-101442 | 4/2005 |
| JP | 2007-115803 | 5/2007 |

* cited by examiner 30
41
PIXEL ARRAY PART
47
43
COLUMN PROCESSOR
44
HORIZONTAL DRIVER
46
42
VERTICAL DRIVER
45
SYSTEM CONTROLLER
49
DATA STORING PART
48
SIGNAL PROCESSOR
IMAGE OUTPUT 50
65C
65B
65A
74
72
VSL
71A
71
63
62
68
SEL
AMP
RST
TRG
64
73
61
n+
(VSL)
(VDD)
(FD)
p-well
n-sub
p+
n
(PD)
70
67
69
66
65
61-2
61-1

CHARGE DRAINING
EXPOSURE AND ACCUMULATION
CHARGE TRANSFER
CHARGE RETENTION
SIGNAL LEVEL READING
RESET LEVEL READING
SEL
RST
TRG
SHD
FD
Vrst
ΔVshd
ΔVsig
ΔVsig
ΔVsig
Vsig
Vrst
t11
t12
t13
t14
t15

50C
VSL
72
71A
71
63
62
n+
(VSL)
p-well
n-sub
65B
68
SEL
n+
70
AMP
67
65C
n+
(VDD)
69
74
RST
66
n+
(FD)
65
65A
64
TRG
91
TRX
n
(MEM)
92
p−
93
73
61-2
p+
n
(PD)
61
61-1

50E
65C
65B
65A
68
64
101
91
73
61
VSL
72
71A
71
63
62
SEL
AMP
RST
TRG
TRX
n+
(VSL)
(VDD)
(FD)
n
(MEM)
p+
(PD)
p-well
n-sub
69
67
68
66
65
92
61-2
61-1

600
601
LENS GROUP
602
SOLID-STATE IMAGING ELEMENT
603
DSP CIRCUIT
604
FRAME MEMORY
605
DISPLAY PART
606
RECORDING PART
607
OPERATION PART
608
POWER SUPPLY PART
609

SOLID-STATE IMAGING ELEMENT, DRIVING METHOD, AND ELECTRONIC APPARATUS

RELATED APPLICATION DATA

This application is a continuation of U.S. patent application Ser. No. 13/312,478 filed Dec. 6, 2011, the entirety of which is incorporated herein by reference to the extent permitted by law. The present application claims the benefit of priority to Japanese Patent Application No. JP2010-279508 filed on Dec. 15, 2010 in the Japan Patent Office, the entirety of which is incorporated by reference herein to the extent permitted by law.

BACKGROUND

The present disclosure relates to solid-state imaging elements, driving methods, and electronic apparatus, and particularly to a solid-state imaging element, a driving method, and electronic apparatus that allow enhancement in the image quality of taken images.

In an image sensor to read out a charge accumulated by a light receiving part via a MOS (Metal Oxide Semiconductor) transistor, it is preferable that the charge be so transferred to a charge-voltage conversion part (so-called floating diffusion, hereinafter referred to also as FD) that the light receiving part becomes fully-depleted in order to read out all of the accumulated charge.

However, if a supply voltage is lowered for the purpose of power saving for example, the voltage of the FD when the FD is reset (reset voltage) decreases corresponding to the lowering of the supply voltage and therefore it becomes difficult to set the light receiving part to the fully-depleted state and completely transfer the accumulated charge. To completely transfer the accumulated charge even when the reset voltage of the FD is lowered, the light receiving part needs to be so designed as to have a shallow potential. However, this reduces the amount of saturation charge.

So, a related-art technique to address this problem has been disclosed. In this technique, a higher voltage is applied by a power supply line or a vertical signal line of the pixel in transfer of the accumulated charge in the light receiving part after the FD is reset to a predetermined voltage. Thereby, the voltage of the FD in a floating state is set high by coupling of parasitic capacitance between the power supply line or the vertical signal line of the pixel and the FD, and the accumulated charge in the light receiving part is easily completely transferred (refer to e.g. Japanese Patent Laid-open No. 2005-86225 and Japanese Patent Laid-open No. 2005-192191).

Another related-art technique has also been disclosed. In this technique, after the FD is reset to a predetermined voltage, a selection signal input to a selection transistor is turned to the active state (turned to a high level). Thereby, the voltage of the FD in the floating state is set high by coupling of parasitic capacitance between the selection signal line to input the selection signal and the FD, and the accumulated charge in the light receiving part is easily completely transferred (refer to e.g. Japanese Patent Laid-open No. 2009-26892 and Japanese Patent Laid-open No. 2009-130679).

As just described, there have been proposed techniques in which a high voltage is applied by an existing signal line such as the power supply line or the vertical signal line of the pixel or the selection signal line to thereby set the voltage of the FD high and easily completely transfer the accumulated charge in the light receiving part.

SUMMARY

In the image sensor that carries out operation of temporarily retaining the charge accumulated by the light receiving part in the pixel, the region to retain the charge (hereinafter, referred to as the charge retaining region) needs to be shielded from light at a layer level that is as low as possible relative to the interconnect layer in order to avoid addition of a signal like a residual image to the signal corresponding to the retained charge due to light incidence on the charge retaining region. Specifically, for example, a light shielding film composed of tungsten (W) is so formed as to cover all or part of the charge retaining region under the lowermost metal interconnect.

In the above-described image sensor, this charge retaining region is provided between the light receiving part and the FD or the FD itself is used as the charge retaining region. However, because the light shielding film is formed under the interconnect layer, parasitic capacitance between the existing signal line and the charge retaining region is low relative to the total capacitance of the charge retaining region. Due to this state, a sufficient modulation effect in the charge retaining region is not obtained and it may be impossible to completely transfer the accumulated charge in the light receiving part. This possibly causes the lowering of the image quality of the taken image.

There is a desire for a technique to allow enhancement in the image quality of the taken image.

According to an embodiment of the present disclosure, there is provided a solid-state imaging element including a plurality of unit pixels configured to each include at least a photoelectric conversion part, a transfer part that transfers a charge generated by the photoelectric conversion part to a predetermined region, and a draining part that drains a charge in the predetermined region. The solid-state imaging element includes also a light shielding film configured to be formed under an interconnect layer in the unit pixels and shield, from light, substantially the whole surface of the plurality of unit pixels except a light receiving part of the photoelectric conversion part, and a voltage controller configured to control a voltage applied to the light shielding film. The voltage controller sets the voltage applied to the light shielding film to a first voltage in charge draining by the draining part and sets the voltage applied to the light shielding film to a second voltage higher than the first voltage in charge transfer by the transfer part.

According to the embodiment of the present disclosure, there is provided a driving method of a solid-state imaging element including a plurality of unit pixels each including a photoelectric conversion part, a transfer part that transfers a charge generated by the photoelectric conversion part to a predetermined region, and a draining part that drains a charge in the predetermined region. The solid-state imaging element includes also a light shielding film that is formed under an interconnect layer in the unit pixels and shields, from light, substantially the whole surface of the plurality of unit pixels except a light receiving part of the photoelectric conversion part, and a voltage controller that controls a voltage applied to the light shielding film. The driving method includes setting the voltage applied to the light shielding film to a first voltage in charge draining by the draining part and setting the voltage applied to the light shielding film to a second voltage higher than the first voltage in charge transfer by the transfer part.

According to the embodiment of the present disclosure, there is provided an electronic apparatus including a solid-state imaging element having a plurality of unit pixels configured to each include a photoelectric conversion part, a transfer part that transfers a charge generated by the photoelectric conversion part to a predetermined region, and a draining part that drains a charge in the predetermined region. The solid-state imaging element includes also a light shielding film configured to be formed under an interconnect layer in the unit pixels and shield, from light, substantially the whole surface of the plurality of unit pixels except a light receiving part of the photoelectric conversion part, and a voltage controller configured to control a voltage applied to the light shielding film. The voltage controller sets the voltage applied to the light shielding film to a first voltage in charge draining by the draining part and sets the voltage applied to the light shielding film to a second voltage higher than the first voltage in charge transfer by the transfer part.

According to another embodiment of the present disclosure, there is provided a solid-state imaging element including a plurality of unit pixels configured to each include a photoelectric conversion part, a transfer part that transfers a charge generated by the photoelectric conversion part to a predetermined region, a reading part that reads out a charge transferred to the predetermined region, and a draining part that drains a charge in the predetermined region. The solid-state imaging element includes also a light shielding film configured to be formed under an interconnect layer in the unit pixels and shield, from light, substantially the whole surface of the plurality of unit pixels except a light receiving part of the photoelectric conversion part, and a voltage controller configured to control a voltage applied to the light shielding film. The voltage controller sets the voltage applied to the light shielding film to a first voltage in a period from charge draining by the draining part to charge transfer by the transfer part, sets the voltage applied to the light shielding film to a second voltage lower than the first voltage in a period to charge reading by the reading part after charge transfer, and sets the voltage applied to the light shielding film to the first voltage in charge reading by the reading part.

According to the embodiment of the present disclosure, there is provided a driving method of a solid-state imaging element including a plurality of unit pixels each having a photoelectric conversion part, a transfer part that transfers a charge generated by the photoelectric conversion part to a predetermined region, a reading part that reads out a charge transferred to the predetermined region, and a draining part that drains a charge in the predetermined region. The solid-state imaging element includes also a light shielding film that is formed under an interconnect layer in the unit pixels and shields, from light, substantially the whole surface of the plurality of unit pixels except a light receiving part of the photoelectric conversion part, and a voltage controller that controls a voltage applied to the light shielding film. The driving method includes setting the voltage applied to the light shielding film to a first voltage in a period from charge draining by the draining part to charge transfer by the transfer part, and setting the voltage applied to the light shielding film to a second voltage lower than the first voltage in a period to charge reading by the reading part after charge transfer and setting the voltage applied to the light shielding film to the first voltage in charge reading by the reading part.

According to the embodiment of the present disclosure, there is provided an electronic apparatus including a solid-state imaging element having a plurality of unit pixels configured to each include a photoelectric conversion part, a transfer part that transfers a charge generated by the photoelectric conversion part to a predetermined region, a reading part that reads out a charge transferred to the predetermined region, and a draining part that drains a charge in the predetermined region. The solid-state imaging element includes also a light shielding film configured to be formed under an interconnect layer in the unit pixels and shield, from light, substantially the whole surface of the plurality of unit pixels except a light receiving part of the photoelectric conversion part, and a voltage controller configured to control a voltage applied to the light shielding film. The voltage controller sets the voltage applied to the light shielding film to a first voltage in a period from charge draining by the draining part to charge transfer by the transfer part, sets the voltage applied to the light shielding film to a second voltage lower than the first voltage in a period to charge reading by the reading part after charge transfer, and sets the voltage applied to the light shielding film to the first voltage in charge reading by the reading part.

In the solid-state imaging element, the driving method, and the former electronic apparatus according to the embodiments, the voltage applied to the light shielding film is set to the first voltage in charge draining by the draining part, and the voltage applied to the light shielding film is set to the second voltage higher than the first voltage in charge transfer by the transfer part.

In the solid-state imaging element, the driving method, and the electronic apparatus according to the latter embodiments, the voltage applied to the light shielding film is set to the first voltage in a period from charge draining by the draining part to charge transfer by the transfer part. Furthermore, the voltage applied to the light shielding film is set to the second voltage lower than the first voltage in a period to charge reading by the reading part after charge transfer, and the voltage applied to the light shielding film is set to the first voltage in charge reading by the reading part.

According to the above-described embodiments of the present disclosure, enhancement in the image quality of the taken image can be achieved.

DETAILED DESCRIPTION OF THE PREFERRED EMBODIMENTS

An embodiment of the present disclosure will be described below with reference to the drawings.

[Configuration of Solid-State Imaging Element]

Figure 1:
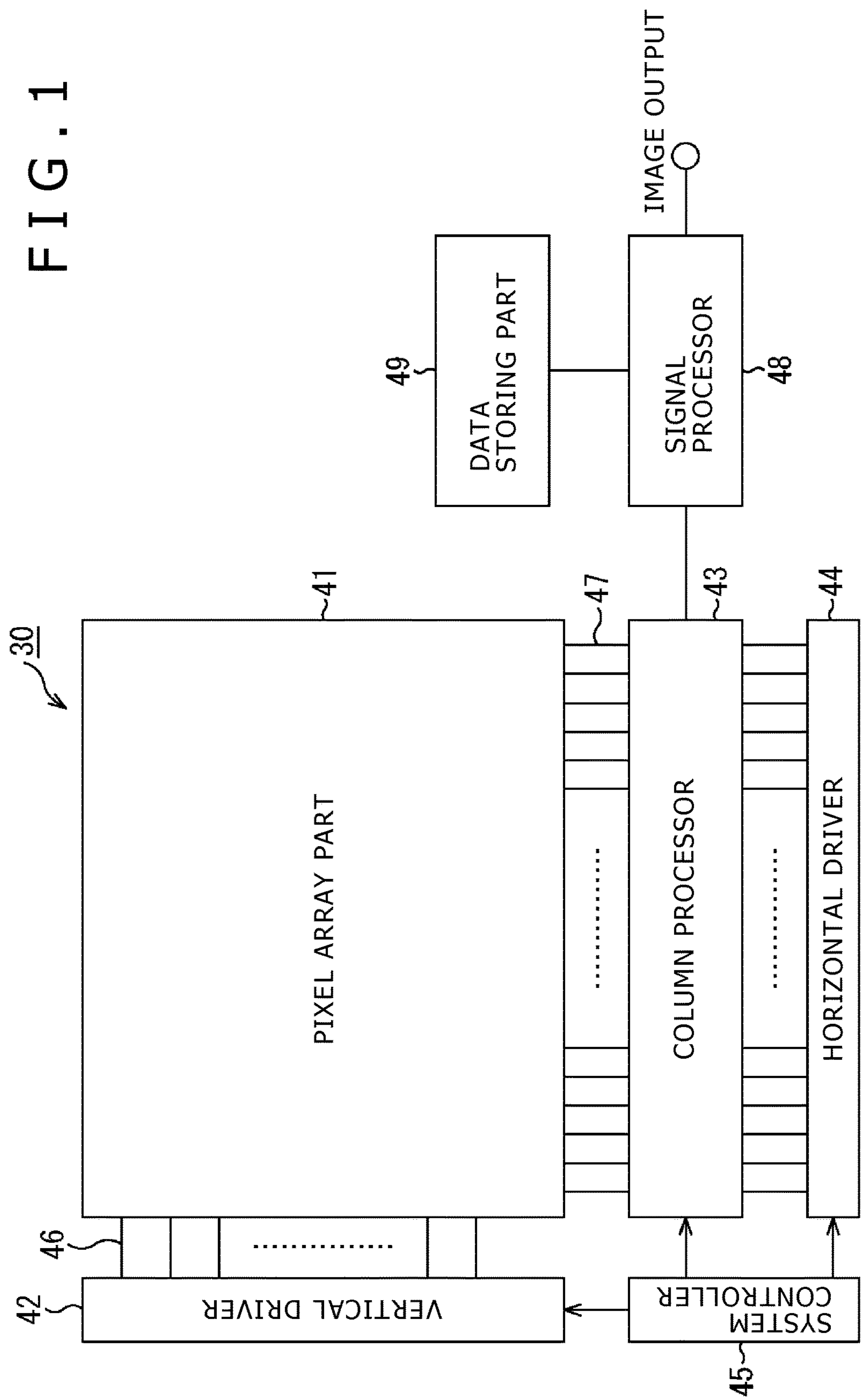
FIG. 1 is a diagram showing a configuration example of a solid-state imaging element to which one embodiment of the present disclosure is applied.

FIG. 1 is a block diagram showing a configuration example of a complementary metal oxide semiconductor (CMOS) image sensor as a solid-state imaging element to which the embodiment of the present disclosure is applied.

A CMOS image sensor 30 includes a pixel array part 41, a vertical driver 42, a column processor 43, a horizontal driver 44, and a system controller 45. The pixel array part 41, the vertical driver 42, the column processor 43, the horizontal driver 44, and the system controller 45 are formed on a semiconductor substrate (chip) (not shown).

In the pixel array part 41, unit pixels (unit pixel 50 of FIGS. 2 and 3) each having a photoelectric conversion element that generates a photocharge having the charge amount depending on the amount of incident light and accumulates it inside are two-dimensionally arranged in a matrix. Hereinafter, the photocharge having the charge amount depending on the amount of incident light will be often referred to simply as "charge" and the unit pixel will be often referred to simply as "pixel."

In the pixel array part 41, for the pixel arrangement in the matrix manner, pixel drive lines 46 are formed on a row-by-row basis along the horizontal direction of the diagram (the arrangement direction of the pixels on the pixel row) and vertical signal lines 47 are formed on a column-by-column basis along the vertical direction of the diagram (the arrangement direction of the pixels on the pixel column). One end of each of the pixel drive lines 46 is connected to the output terminal of the vertical driver 42 corresponding to a respective one of the rows.

The CMOS image sensor 30 further includes a signal processor 48 and a data storing part 49. The signal processor 48 and the data storing part 49 may be external signal processors provided on a substrate different from that of the CMOS image sensor 30, such as a digital signal processor (DSP) or processing by software. Alternatively, the signal processor 48 and the data storing part 49 may be mounted on the same substrate as that of the CMOS image sensor 30.

The vertical driver 42 is a pixel driver that is configured with a shift register, an address decoder, and so forth and drives the respective pixels of the pixel array part 41 simultaneously for all pixels or on a row-by-row basis. This vertical driver 42 has a read scanning system and a sweep scanning system or a function of collective sweep and collective transfer although diagrammatic representation of its specific configuration is omitted.

The read scanning system selectively scans the unit pixels of the pixel array part 41 in turn on a row-by-row basis in order to read out signals from the unit pixels. As for sweep, in the case of row driving (rolling shutter operation), sweep scanning is performed on a read row for which read scanning is to be performed by the read scanning system earlier than the read scanning by the time of the shutter speed. In the case of global exposure (global shutter operation), collective sweep is performed earlier than collective transfer by the time of the shutter speed.

By this sweep, the unnecessary charge is swept out (reset) from the photoelectric conversion elements of the unit pixels on the read row. By the sweep (reset) of the unnecessary charge, so-called electronic shutter operation is carried out. The electronic shutter operation refers to an operation of discarding the photocharge in the photoelectric conversion element and newly starting exposure (starting accumulation of a photocharge).

The signal read out by the read operation of the read scanning system corresponds to the amount of light that is incident after the previous read operation or the electronic shutter operation. In the case of row driving, the period from the read timing of the previous read operation or the sweep timing of the electronic shutter operation to the read timing of the present read operation is equivalent to the accumulation time of the photocharge (exposure time) in the unit pixel. In the case of global exposure, the time from collective sweep to collective transfer is the accumulation time (exposure time).

The pixel signal output from each of the unit pixels on the pixel row selectively scanned by the vertical driver 42 is supplied to the column processor 43 via a respective one of the vertical signal lines 47. For each pixel column of the pixel array part 41, the column processor 43 executes predetermined signal processing for the pixel signal output from each of the unit pixels on a selected row via a vertical signal line 47 and temporarily retains the pixel signal resulting from the signal processing.

Specifically, the column processor 43 executes noise removal processing, e.g. correlated double sampling (CDS) processing, as the signal processing. By the CDS in the column processor 43, fixed pattern noise specific to pixels, such as reset noise and variation in the threshold voltage of an amplification transistor, is removed. It is also possible that the column processor 43 is equipped with e.g. an analog-digital (AD) conversion function besides the noise removal processing function so that the signal level is output by a digital signal.

The horizontal driver 44 is configured with a shift register, an address decoder, and so forth and selects the unit circuit corresponding to the pixel column of the column processor 43 in turn. By this selective scanning by the horizontal driver 44, the pixel signal resulting from the signal processing by the column processor 43 is output to the signal processor 48 in turn.

The system controller 45 is configured with a timing generator to generate various kinds of timing signals, and so forth, and controls driving of the vertical driver 42, the column processor 43, the horizontal driver 44, and so forth based on the various kinds of timing signals generated by the timing generator.

The signal processor 48 has a function of addition and executes various kinds of signal processing such as addition on the pixel signal output from the column processor 43. For the signal processing by the signal processor 48, the data storing part 49 temporarily stores the data used for the processing.

[Structure of Unit Pixel]

The specific structure of the unit pixel 50 disposed in a matrix manner in the pixel array part 41 in FIG. 1 will be described below.

Figure 2:
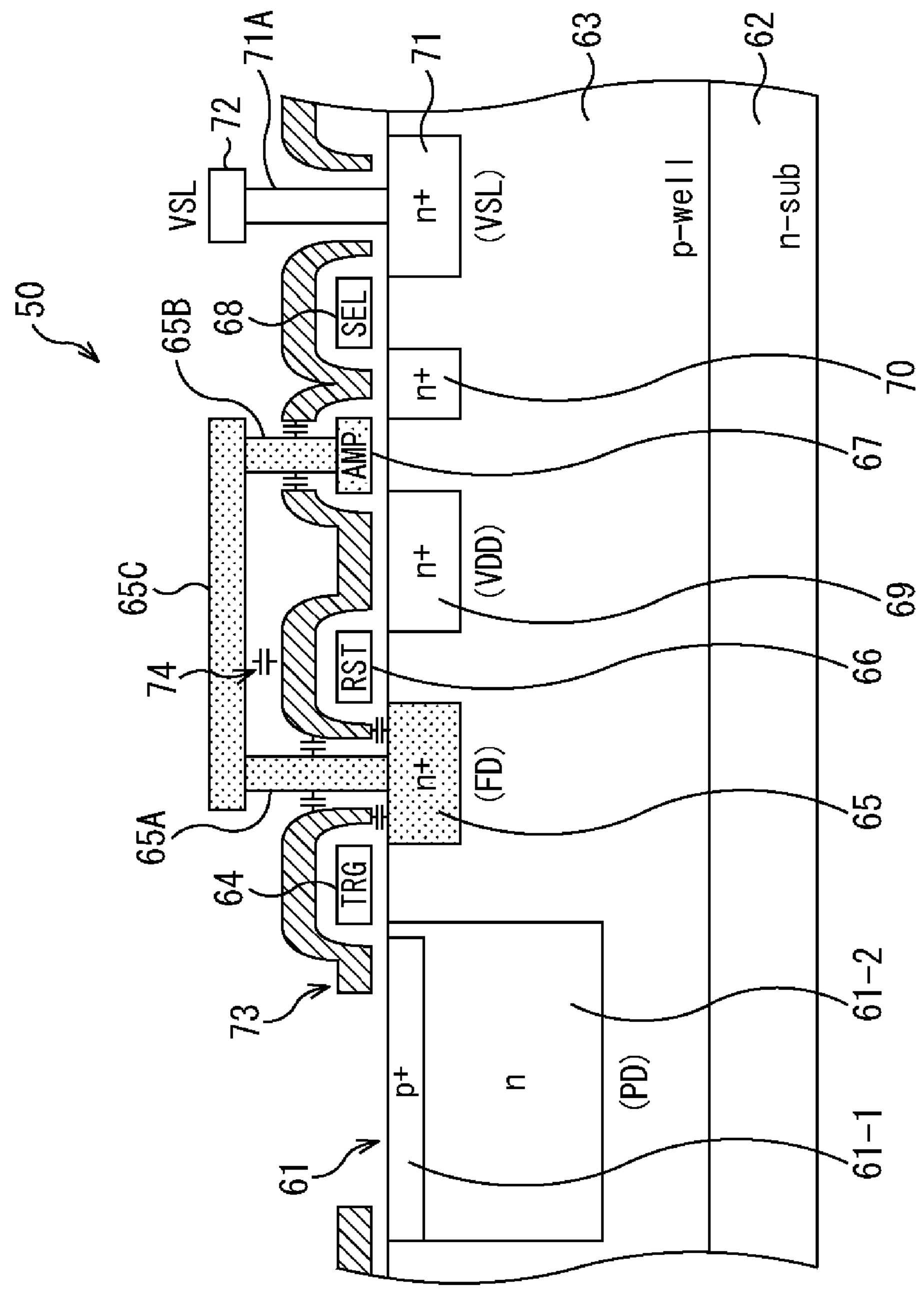
FIG. 2 is a diagram showing a configuration example of a unit pixel.
Figure 3:
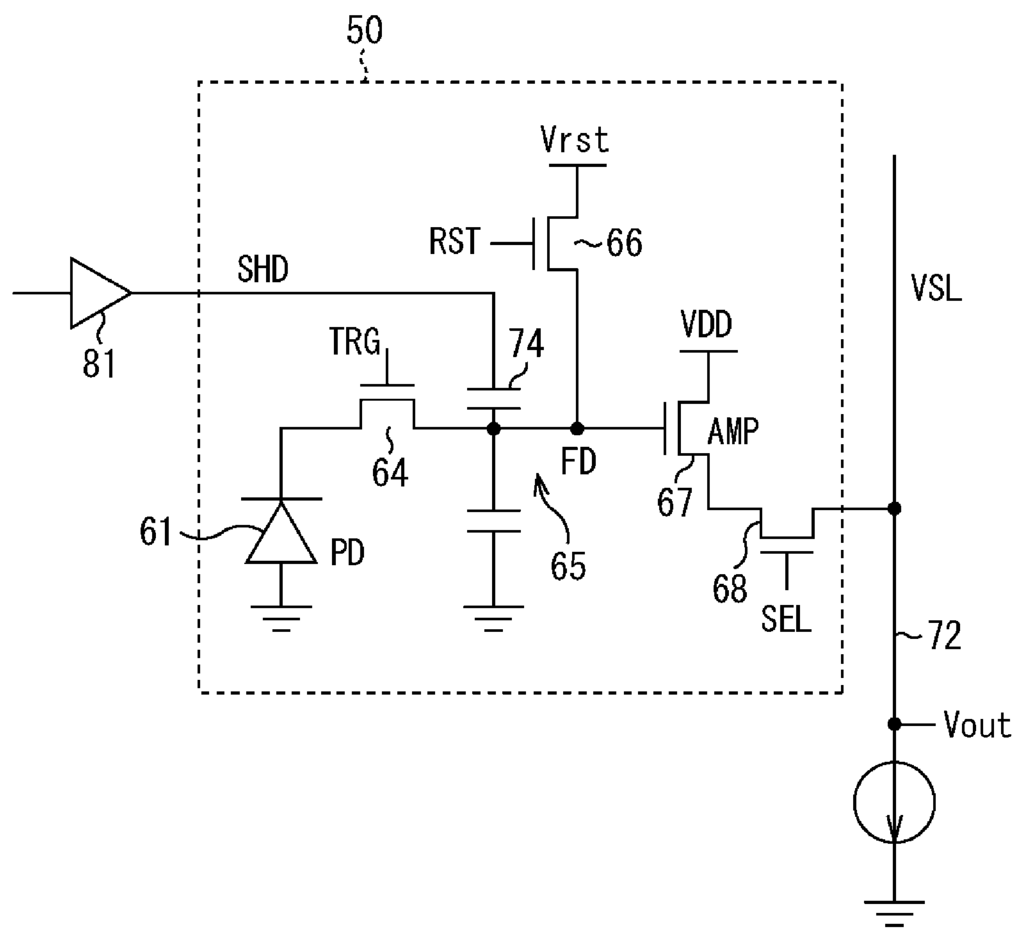
FIG. 3 is a diagram showing a circuit configuration example of the unit pixel.

FIG. 2 shows a configuration example of a section of the unit pixel 50 and FIG. 3 shows a circuit configuration example of the unit pixel 50.

The unit pixel 50 has e.g. a photodiode (PD) 61 as the photoelectric conversion element. The photodiode 61 is e.g. a buried-type photodiode formed by forming a p-type layer

61-1 on the surface side of the substrate and burying an n-type buried layer 61-2 in a p-type well layer 63 formed on an n-type substrate 62. The impurity concentration of the p-type layer 61-1 and the n-type buried layer 61-2 is so designed that these layers become depleted in charge draining.

The unit pixel 50 has a transfer gate 64 and a floating diffusion region (floating diffusion (FD)) 65 in addition to the photodiode 61.

A drive signal TRG is applied to the gate electrode of the transfer gate 64. Thereby, the transfer gate 64 transfers, to the floating diffusion region 65, a charge that is generated by photoelectric conversion by the photodiode 61 and accumulated inside the photodiode 61.

The floating diffusion region 65 is a charge-voltage conversion part formed of an n-type layer and converts the charge transferred from the photodiode 61 by the transfer gate 64 to a voltage. A contact 65A (FIG. 2) for interconnection is connected to the upper part of the floating diffusion region 65. The contact 65A is connected to an interconnect 65C.

The unit pixel 50 further has a reset transistor 66, an amplification transistor 67, and a selection transistor 68. FIG. 2 shows an example in which n-channel MOS transistors are used as the reset transistor 66, the amplification transistor 67, and the selection transistor 68. However, the combination of the conductivity types of the reset transistor 66, the amplification transistor 67, and the selection transistor 68 is not limited to this combination.

The drain electrode of the reset transistor 66 is connected to a power supply Vrst and the source electrode of the reset transistor 66 is connected to the floating diffusion region 65. A drive signal RST is applied to the gate electrode of the reset transistor 66 and the reset transistor 66 is turned on. Thereby, the floating diffusion region 65 is reset and the charge is drained from the floating diffusion region 65.

The drain electrode of the amplification transistor 67 is connected to a power supply 69 (VDD) via a contact (not shown) and the gate electrode of the amplification transistor 67 is connected to the floating diffusion region 65 via a contact 65B, the interconnect 65C, and the contact 65A (FIG. 2). The drain electrode of the selection transistor 68 is connected to the source electrode of the amplification transistor 67 via an n-type layer 70 and the source electrode of the selection transistor 68 is connected to a vertical signal line 72 via an n-type layer 71 and a contact 71A. A drive signal SEL is applied to the gate electrode of the selection transistor 68 and the selection transistor 68 is turned on. Thereby, the unit pixel 50 as the subject of reading of the pixel signal is selected. That is, when the selection transistor 68 is in the on-state, the amplification transistor 67 supplies the pixel signal indicating the voltage of the floating diffusion region 65 to the column processor 43 via the n-type layer 70, the selection transistor 68, the n-type layer 71, the contact 71A, and the vertical signal line 72. The vertical signal line 72 is the same as the vertical signal line 47 in FIG. 1 and is connected to a constant current source of a source follower circuit (FIG. 2).

It is also possible to connect the selection transistor 68 between the power supply 69 (VDD) and the drain electrode of the amplification transistor 67. Furthermore, it is also possible that one or some of the reset transistor 66, the amplification transistor 67, and the selection transistor 68 are omitted or shared among plural pixels depending on the method for reading the pixel signal.

A light shielding film 73 composed of a metal such as tungsten is formed on the top surface of the unit pixel 50 and under the interconnect layer composed of the interconnect 65C, the vertical signal line 72, and so forth. As described in detail later, apertures of the light shielding film 73 are made corresponding to only the light receiving part of the photodiode 61 and the parts where the contacts 65A, 65B, 71A, and so forth are formed.

The aperture of the light shielding film 73 for the light receiving part of the photodiode 61 is so designed as to have the optimum size and position in consideration of the trade-off between the optical sensitivity of the photodiode 61 and noise generated in the floating diffusion region 65. The noise generated in the floating diffusion region 65 is noise generated on the same principle as that of smear in a CCD image sensor. Specifically, for example this noise is generated due to phenomena that light is incident on the floating diffusion region 65 and its vicinity through the aperture of the light shielding film 73 and thus a charge is generated in the floating diffusion region 65 and that an externally generated charge diffuses and flows into the floating diffusion region 65.

The apertures of the light shielding film 73 for the contacts 65A, 65B, 71A, and so forth are made with aperture sizes somewhat larger than the sections of the respective contacts and predetermined gaps are ensured between the respective contacts and the light shielding film 73 in order to prevent short circuit between both. However, if the gaps between the respective contacts and the light shielding film 73 are too narrow, short circuit easily occurs. In contrast, if the gaps between the respective contacts and the light shielding film 73 are too wide, stray light is incident through the aperture and noise generated on the same principle as that of the above-described smear increases due to this stray light. Therefore, the apertures for the respective contacts are also so designed as to have the optimum size in consideration of the trade-off between these two characteristics.

A drive circuit 81 (FIG. 3) is connected to the light shielding film 73 and a light shielding film voltage SHD that takes plural voltage values is applied from the drive circuit 81 based on control by the system controller 45. Thereby, the light shielding film 73 is capacitively coupled to the surface of the floating diffusion region 65, the contacts 65A and 65B, and the interconnect 65C. Parasitic capacitance 74 generated in this manner is a factor that is dominant over the total capacitance of the floating diffusion region 65. In FIG. 2, the parasitic capacitance 74 includes also the figures represented between the light shielding film 73 and each of the floating diffusion region 65 and the contacts 65A and 65B like the figure represented between the light shielding film 73 and the interconnect 65C.

First Operation Example 1 of Unit Pixel

Figure 4:
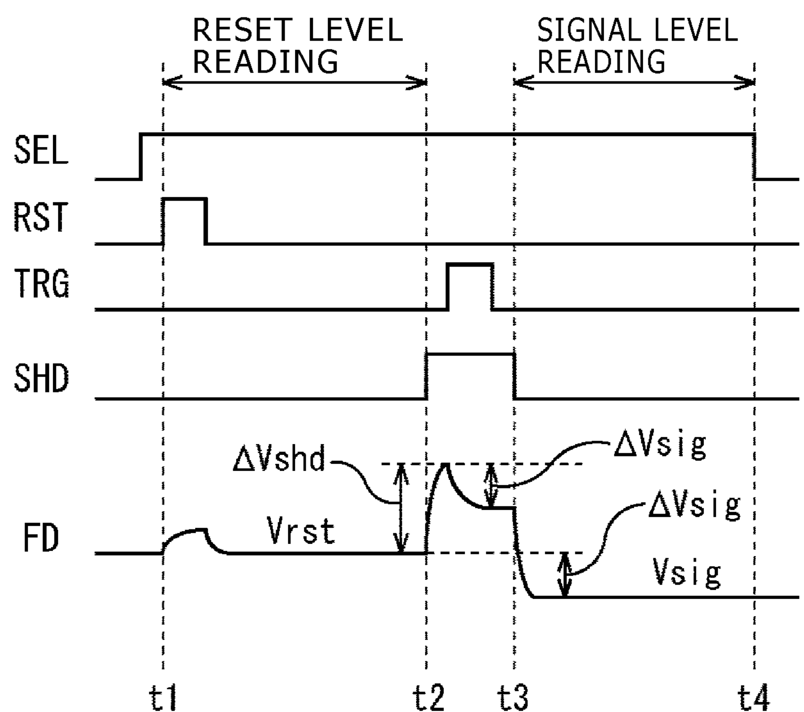
FIG. 4 is a diagram for explaining a first operation example of the unit pixel.

With reference to a timing chart of FIG. 4, the operation (driving method) of the unit pixel 50 when the charge in the photodiode 61 is read out in the unit pixel 50 will be described below.

First, in the state in which the drive signal SEL is at the high (H) level, the drive signal RST is applied in a pulse manner at a time t1. Thereupon, the charge accumulated in the floating diffusion region 65 is reset (drained) by the reset transistor 66 and the voltage FD of the floating diffusion region 65 becomes Vrst. This reset state continues until the drive signal TRG becomes the H level. During the reset state, the voltage of the reset level is read out.

Thereafter, when the drive signal TRG becomes the H level, the charge accumulated in the photodiode 61 is transferred to the floating diffusion region 65 by the transfer gate 64 and the voltage of the signal level is read out until the drive signal SEL becomes the low (L) level at a time t4.

In this manner, so-called CDS processing of removing noise by taking the difference between the read reset level and signal level is executed. Thereby, the pixel signal from which the noise is removed can be read out.

When the charge accumulated in the photodiode 61 is transferred to the floating diffusion region 65 by the transfer gate 64, i.e. in the period from a time t2 to a time t3, the light shielding film voltage SHD is set to the H level from the L level applied thus far. Thereby, the light shielding film 73 is set to the high voltage and the voltage FD of the floating diffusion region 65 is modulated by ΔVshd due to the parasitic capacitance 74 between the light shielding film 73 and the floating diffusion region 65. Subsequently, in response to the charge transfer from the photodiode 61 to the floating diffusion region 65, the voltage FD of the floating diffusion region 65 drops by ΔVsig corresponding to the transferred charge.

When the light shielding film voltage SHD is turned from the H level to the L level at the time t3, the light shielding film 73 is set to the low voltage and the voltage FD of the floating diffusion region 65 is modulated by −ΔVshd. Thereby, in the reading period of the signal level, the voltage FD of the floating diffusion region 65 is kept at a voltage Vsig lower by ΔVsig than the voltage Vrst set by the reset transistor 66.

According to the above-described operation, when the charge accumulated in the photodiode 61 is transferred to the floating diffusion region 65 by the transfer gate 64, the voltage FD of the floating diffusion region 65 is modulated by ΔVshd and the difference in the potential from the light receiving part (photodiode 61) can be increased. Thus, the accumulated charge in the light receiving part can be completely transferred without being left. This can increase the amount of saturation charge and reduce the residual image. Thus, enhancement in the image quality of taken images can be achieved.

The lower voltage of the light shielding film 73 (light shielding film voltage SHD at the L level) can be set to a negative voltage. This makes it possible to form an inversion layer around the Si surface of the floating diffusion region 65 and suppress the occurrence of a dark current generated from a crystal defect around the Si surface and a dot defect.

The above-described operation can also be applied to global shutter operation with use of the floating diffusion region 65 as the charge retaining region in the CMOS image sensor 30.

First Operation Example 2 of Unit Pixel

With reference to a timing chart of FIG. 5, the operation (driving method) of the unit pixel 50 in the CMOS image sensor 30 that carries out global shutter operation will be described below.

Figure 5:
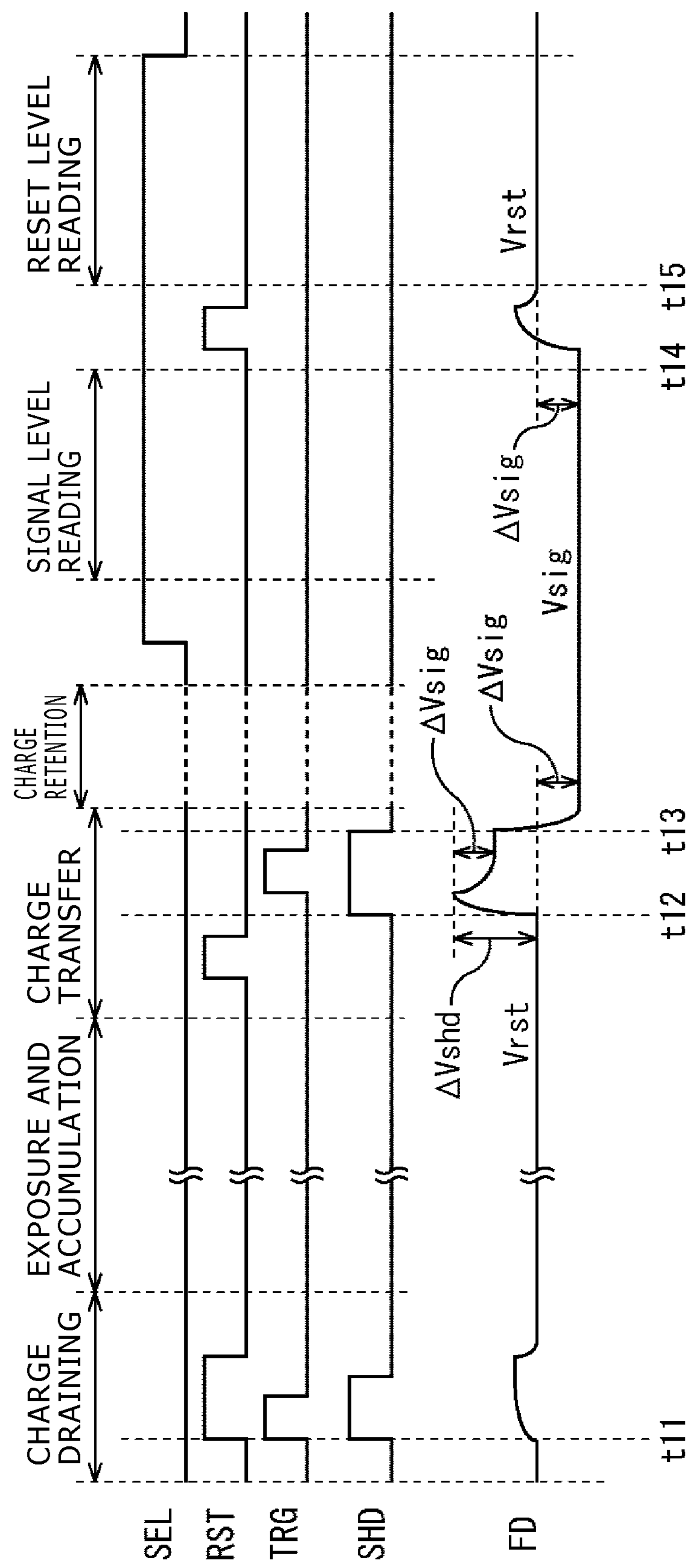
FIG. 5 is a diagram for explaining a first operation example of the unit pixel.

In the CMOS image sensor 30, charge draining in the charge draining period, exposure and accumulation in the exposure-and-accumulation period, and charge transfer in the charge transfer period, shown in the timing chart of FIG. 5, are performed collectively for all pixels. Charge retention in the charge retention period, signal level reading in the signal level reading period, and reset level reading in the reset level reading period are performed on a row-by-row basis.

First, at a time t11 in the charge draining period, the drive signals RST and TRG and the light shielding film voltage SHD are applied in a pulse manner for all unit pixels 50. Thereupon, the charge accumulated in the photodiode 61 and the floating diffusion region 65 is reset and the voltage FD of the floating diffusion region 65 becomes Vrst.

Thereby, the charge accumulated in the photodiode 61 thus far is swept out. In the subsequent exposure-and-accumulation period, a charge newly obtained from light from a subject is accumulated in the photodiode 61.

After the exposure-and-accumulation period, in the charge transfer period, the drive signal RST is applied in a pulse manner and the charge accumulated in the floating diffusion region 65 is reset again for all unit pixels 50. Thereafter, the light shielding film voltage SHD is turned from the L level to the H level when the charge accumulated in the photodiode 61 is transferred to the floating diffusion region 65 by the transfer gate 64, i.e. in the period from a time t12 to a time t13, in which the drive signal TRG is set to the H level from the L level. Thereby, the light shielding film 73 is set to the high voltage and the voltage FD of the floating diffusion region 65 is modulated by ΔVshd due to the parasitic capacitance 74 between the light shielding film 73 and the floating diffusion region 65. Subsequently, in response to the charge transfer from the photodiode 61 to the floating diffusion region 65, the voltage FD of the floating diffusion region 65 drops by ΔVsig corresponding to the transferred charge.

When the light shielding film voltage SHD is turned from the H level to the L level at the time t13, the light shielding film 73 is set to the low voltage and the voltage FD of the floating diffusion region 65 is modulated by −ΔVshd. Thereby, in the charge retention period, the voltage FD of the floating diffusion region 65 is kept at the voltage Vsig lower by ΔVsig than the voltage Vrst set by the reset transistor 66.

After the charge retention period, when the drive signal SEL is turned from the L level to the H level for the unit pixels 50 on a row-by-row basis, the voltage corresponding to the charge accumulated in the floating diffusion region 65, i.e. the voltage of the signal level, is read out until the drive signal RST is turned to the H level at a time t14.

When the drive signal RST is set to the H level in the period from the time t14 to a time t15, the charge accumulated in the floating diffusion region 65 is reset (drained) by the reset transistor 66 and the voltage FD of the floating diffusion region 65 becomes Vrst. This reset state continues until the drive signal SEL becomes the L level. During the reset state, the voltage of the reset level is read out. In this manner, the CDS processing of removing noise by taking the difference between the read reset level and signal level is executed. Thereby, the pixel signal from which the noise is removed is read out.

According to the above-described operation, for all unit pixels 50, when the charge accumulated in the photodiode 61 is transferred to the floating diffusion region 65 by the transfer gate 64, the voltage FD of the floating diffusion region 65 is modulated by ΔVshd and the difference in the potential from the light receiving part (photodiode 61) can be increased. Thus, the accumulated charge in the light receiving part can be completely transferred without being left also in the CMOS image sensor 30 that carries out global shutter operation. This can increase the amount of saturation charge and reduce the residual image. Thus, enhancement in the image quality of the taken image can be achieved.

Also in the above-described operation, the lower voltage of the light shielding film 73 (light shielding film voltage SHD at the L level) can be set to a negative voltage. This makes it possible to form an inversion layer around the Si surface of the floating diffusion region 65 and suppress the occurrence of a dark current generated from a crystal defect around the Si surface and a dot defect.

The CMOS image sensor 30 may have the following configuration. Specifically, the light shielding film 73 is so formed as to be separated along the drive scanning direction in units of one row or plural rows and is driven on a row-by-row basis. Furthermore, in association with this separated light shielding film 73, the drive circuit (not shown) to apply the drive signal TRG to the gate electrode of the transfer gate 64 serves also as the drive circuit 81 connected to the light shielding film 73. This configuration eliminates the need to provide the drive circuit 81. Therefore, the drive circuit provided in the CMOS image sensor 30 can be eliminated and the power consumption can be decreased. In addition, the load resistance (interconnect resistance) when the light shielding film voltage SHD is applied to the light shielding film 73 can be reduced.

In the above-described operation, the voltage of the light shielding film 73 is set high while the charge accumulated in the photodiode 61 is transferred to the floating diffusion region 65 in the charge transfer period.

Second Operation Example of Unit Pixel

With reference to a timing chart of FIG. 6, second operation (driving method) of the unit pixel 50 in the CMOS image sensor 30 that carries out global shutter operation will be described below.

Figure 6:
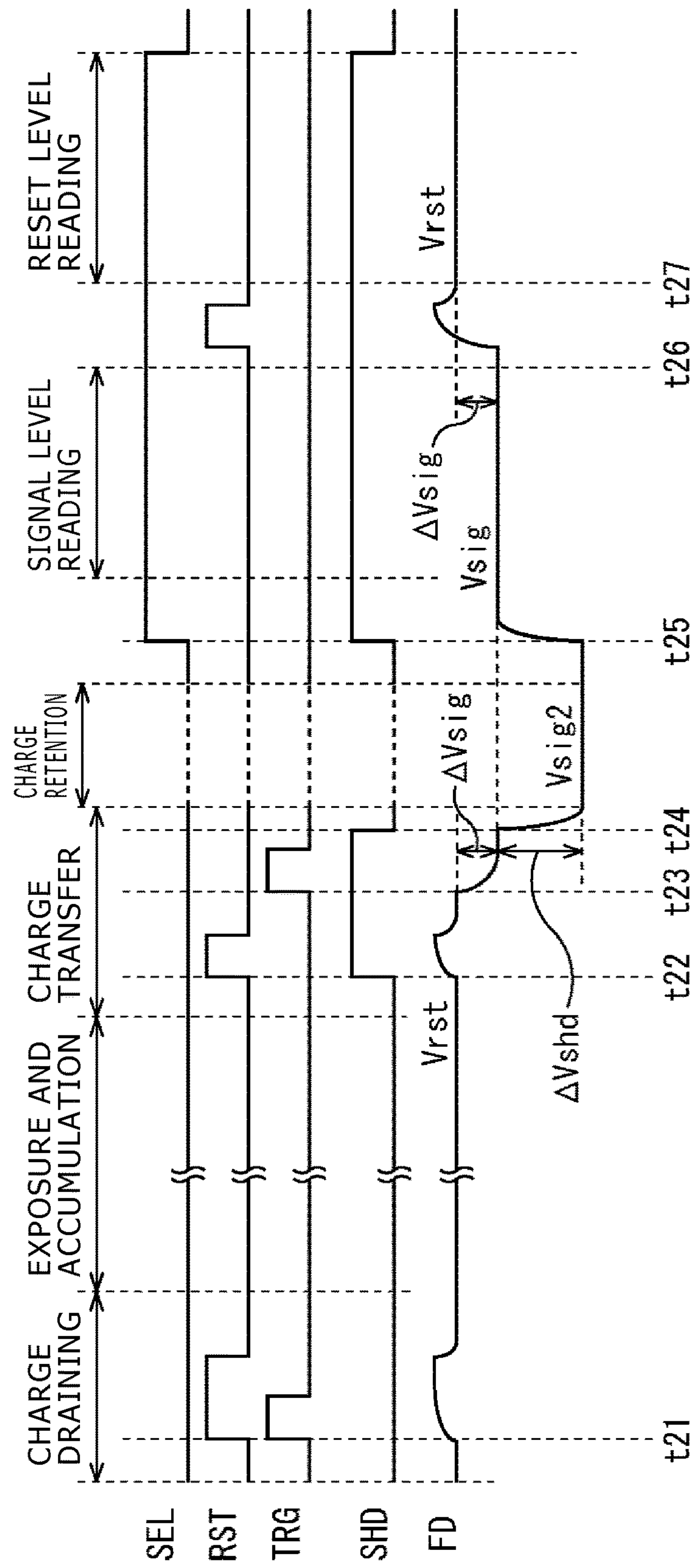
FIG. 6 is a diagram for explaining a second operation example of the unit pixel.

Also in the CMOS image sensor 30 that carries out the operation described below, charge draining in the charge draining period, exposure and accumulation in the exposure-and-accumulation period, and charge transfer in the charge transfer period, shown in the timing chart of FIG. 6, are performed collectively for all pixels. Charge retention in the charge retention period, signal level reading in the signal level reading period, and reset level reading in the reset level reading period are performed on a row-by-row basis.

First, at a time t21 in the charge draining period, the drive signals RST and TRG are applied in a pulse manner for all unit pixels 50. Thereupon, the charge accumulated in the photodiode 61 and the floating diffusion region 65 is reset and the voltage FD of the floating diffusion region 65 becomes Vrst.

Thereby, the charge accumulated in the photodiode 61 thus far is swept out. In the subsequent exposure-and-accumulation period, a charge newly obtained from light from a subject is accumulated in the photodiode 61.

After the exposure-and-accumulation period, at a time t22 in the charge transfer period, the drive signal RST is applied in a pulse manner and the charge accumulated in the floating diffusion region 65 is reset for all unit pixels 50. At this time, the light shielding film voltage SHD is turned from the L level to the H level. Thereby, the light shielding film 73 is set to the high voltage. However, the voltage FD of the floating diffusion region 65 temporarily rises up and then becomes Vrst again.

At a time t23, the drive signal TRG is turned from the L level to the H level and the charge accumulated in the photodiode 61 is transferred to the floating diffusion region 65 by the transfer gate 64. In response to this transfer, the voltage FD of the floating diffusion region 65 is kept at the voltage Vsig lower by ΔVsig corresponding to the transferred charge.

Subsequently, when the light shielding film voltage SHD is turned from the H level to the L level at a time t24, the light shielding film 73 is set to the low voltage and the voltage FD of the floating diffusion region 65 is modulated by −ΔVshd due to the parasitic capacitance 74 between the light shielding film 73 and the floating diffusion region 65. Thereby, in the charge retention period, the voltage FD of the floating diffusion region 65 is kept at a voltage Vsig2 lower by (ΔVsig+ΔVshd) than the voltage Vrst set by the reset transistor 66.

After the charge retention period, at a time t25, the drive signal SEL is turned from the L level to the H level and the light shielding film voltage SHD is turned from the L level to the H level for the unit pixels 50 on a row-by-row basis. In response to this operation, the voltage corresponding to the charge accumulated in the floating diffusion region 65, i.e. the voltage of the signal level, is read out. In addition, the light shielding film 73 is set to the high voltage. Thereby, in the signal level reading period, the voltage FD of the floating diffusion region 65 is modulated by ΔVshd and kept at the voltage Vsig lower by ΔVsig than the voltage Vrst set by the reset transistor 66.

In this manner, the voltage FD of the floating diffusion region 65 returns to the voltage Vsig in the signal level reading period although being kept at the voltage Vsig2 lower than the voltage Vsig in the charge retention period. Thus, as the voltage range necessary for the signal level reading, a range similar to that in the related-art operation can be employed.

When the drive signal RST is set to the H level in the period from a time t26 to a time t27, the charge accumulated in the floating diffusion region 65 is reset by the reset transistor 66 and the voltage FD of the floating diffusion region 65 becomes Vrst. This reset state continues until the drive signal SEL becomes the L level. During the reset state, the voltage of the reset level is read out. In this manner, the CDS processing of removing noise by taking the difference between the read reset level and signal level is executed. Thereby, the pixel signal from which the noise is removed is read out. The light shielding film voltage SHD is turned from the H level to the L level simultaneously with the switch of the drive signal SEL to the L level.

According to the above-described operation, for all unit pixels 50, the voltage FD of the floating diffusion region 65 is modulated by −ΔVshd after the charge accumulated in the photodiode 61 is transferred to the floating diffusion region 65 by the transfer gate 64. Thus, the voltage FD of the floating diffusion region 65 in the charge retention period can be kept at a further lower voltage. This alleviates the intensity of the electric field applied to the floating diffusion region 65 and can suppress the occurrence of dark current and dot defect. Consequently, enhancement in the image quality of the taken image can be achieved.

Also in the above-described operation, the lower voltage of the light shielding film 73 (light shielding film voltage SHD at the L level) can be set to a negative voltage. This makes it possible to form an inversion layer around the Si surface of the floating diffusion region 65 and further suppress a dark current generated from a crystal defect around the Si surface and a dot defect.

In the CMOS image sensor 30, the light shielding film 73 may be so formed as to be separated along the drive scanning direction in units of one row or plural rows and may be driven on a row-by-row basis. By employing this configuration, the voltage FD of the floating diffusion region 65 can be kept at a further lower voltage for only the charge retention period corresponding to the row to be read out in the sequential reading on a row-by-row basis.

Furthermore, if the light shielding film 73 is so formed as to be separated along the drive scanning direction and is driven on a row-by-row basis, the drive circuit (not shown)

to apply the drive signal SEL to the gate electrode of the selection transistor 68 may be used also as the drive circuit 81 connected to the light shielding film 73 in the CMOS image sensor 30 that carries out the above-described second operation.

Figure 7:
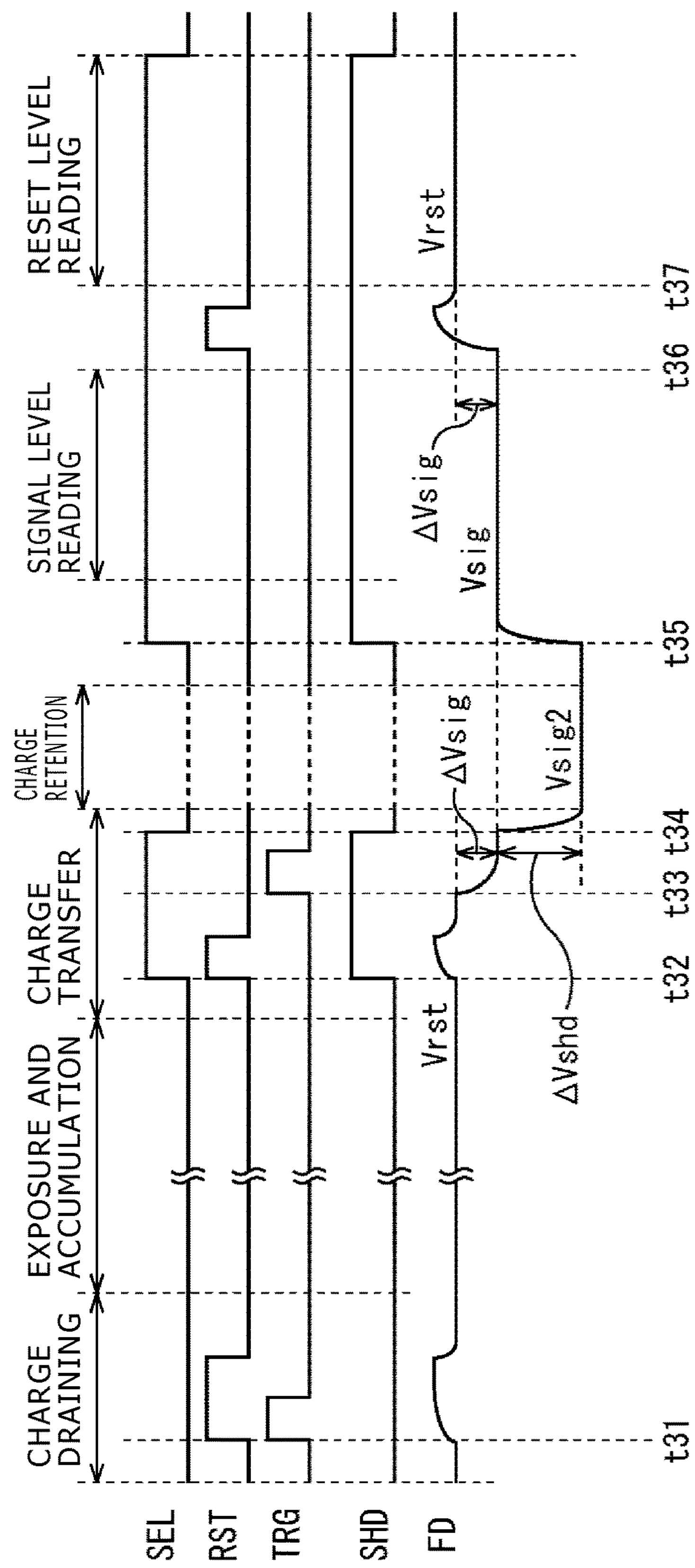
FIG. 7 is a diagram for explaining a second operation example of the unit pixel.

FIG. 7 is a timing chart for explaining the operation (driving method) of the unit pixel 50 in the CMOS image sensor 30 in which the drive circuit to apply the drive signal SEL to the gate electrode of the selection transistor 68 serves also as the drive circuit 81 connected to the light shielding film 73.

By using the drive circuit for the selection transistor 68 also as the drive circuit 81, the drive signal SEL and the light shielding film voltage SHD are applied at the same timing as shown in the timing chart of FIG. 7.

In this case, in the CMOS image sensor 30, in the charge transfer period, the driving of the selection transistor 68 and the light shielding film 73 separated along the drive scanning direction is performed collectively for all pixels. In the signal level reading period and the reset level reading period, the driving of the selection transistor 68 and the light shielding film 73 separated along the drive scanning direction is performed on a row-by-row basis.

By using the drive circuit for the selection transistor 68 also as the drive circuit 81 in this manner, the need to provide the drive circuit 81 is eliminated. Therefore, the drive circuit provided in the CMOS image sensor 30 can be reduced and the power consumption can be decreased. In addition, the load resistance (interconnect resistance) when the light shielding film voltage SHD is applied to the light shielding film 73 can be reduced.

The embodiment of the present disclosure can be employed also for structures other than those of the unit pixel explained for the above-described embodiment. Other structures of the unit pixel to which the embodiment of the present disclosure can be applied will be described below. In the diagrams used in the following description, the part corresponding to that in FIG. 2 is given the same numeral and description thereof is accordingly omitted.

Another First Configuration Example of Unit Pixel

Figure 8:
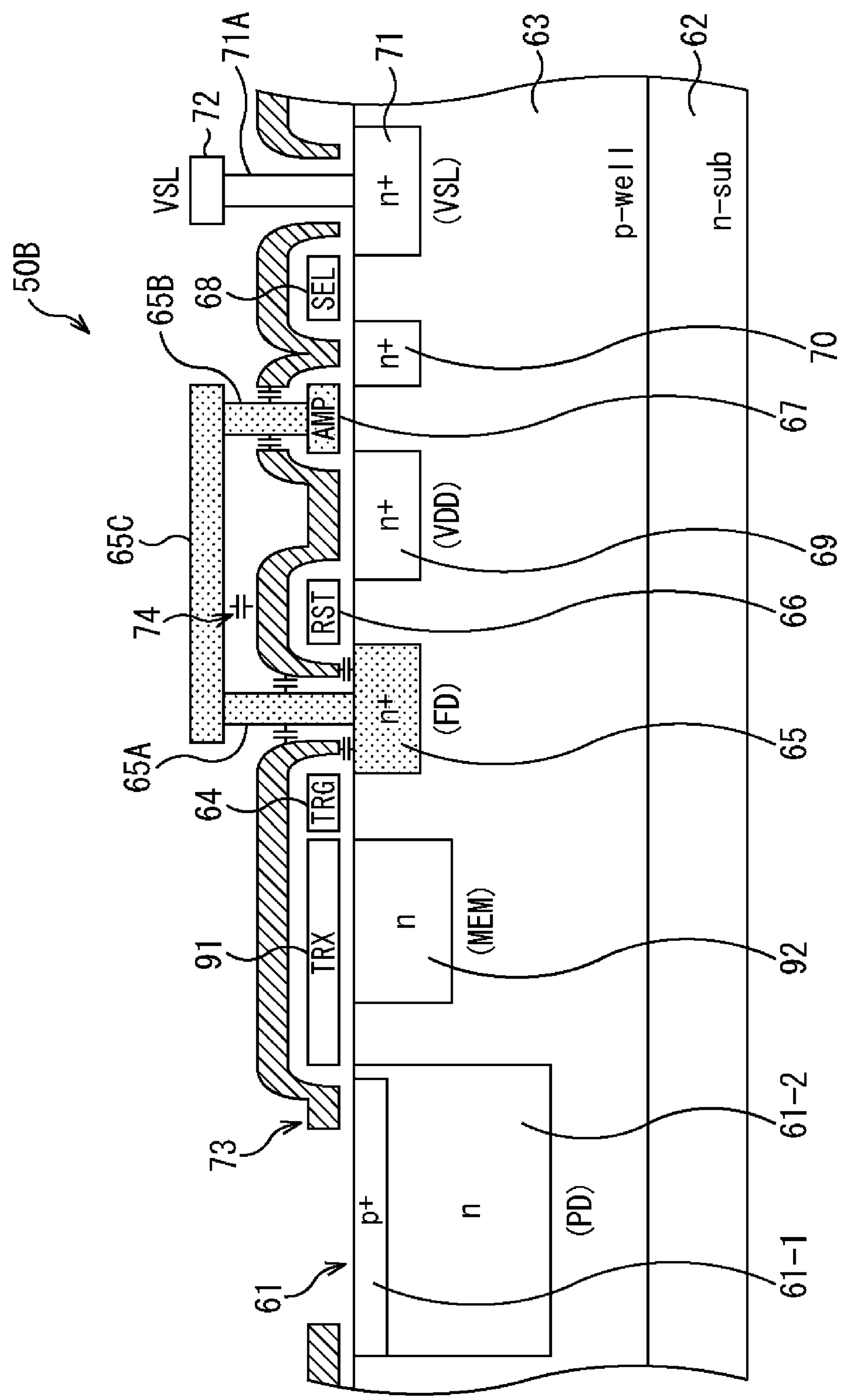
FIG. 8 is a diagram showing another first configuration example of the unit pixel.

FIG. 8 is a diagram showing another first configuration example of the unit pixel 50.

In a unit pixel 50B of FIG. 8, a transfer gate 91 and a memory part 92 are provided between the photodiode 61 and the transfer gate 64 in addition to the configuration of FIG. 2.

A drive signal TRX is applied to the gate electrode of the transfer gate 91. Thereby, the transfer gate 91 transfers a charge that is generated by photoelectric conversion by the photodiode 61 and accumulated inside the photodiode 61. The memory part 92 is shielded from light and formed of an n-type buried channel formed under the transfer gate 91. The memory part 92 accumulates the charge transferred from the photodiode 61 by the transfer gate 91. Forming the memory part 92 by the buried channel can suppress the occurrence of a dark current around the Si—$SiO_2$ interface and thus contribute to enhancement in the image quality.

Modulation can be applied to the memory part 92 by disposing the gate electrode of the transfer gate 91 above the memory part 92 and applying the drive signal TRX to this gate electrode. Specifically, the potential of the memory part 92 becomes deeper by the application of the drive signal TRX to the gate electrode of the transfer gate 91. This can increase the amount of saturation charge of the memory part 92 compared with the case of applying no modulation.

In the unit pixel 50B of FIG. 8, the transfer gate 64 transfers the charge accumulated in the memory part 92 to the floating diffusion region 65 when the drive signal TRG is applied to its gate electrode (not shown).

That is, in the unit pixel 50B of FIG. 8, in the case of the first operation, the voltage FD of the floating diffusion region 65 is modulated when the charge accumulated in the memory part 92 is transferred to the floating diffusion region 65 by the transfer gate 64. In the case of the second operation, the voltage FD of the floating diffusion region 65 is modulated after the charge accumulated in the memory part 92 is transferred to the floating diffusion region 65 by the transfer gate 64. In the unit pixel 50B of FIG. 8, another charge retaining region different from the memory part 92 may be further provided.

Another Second Configuration Example of Unit Pixel

Figure 9:
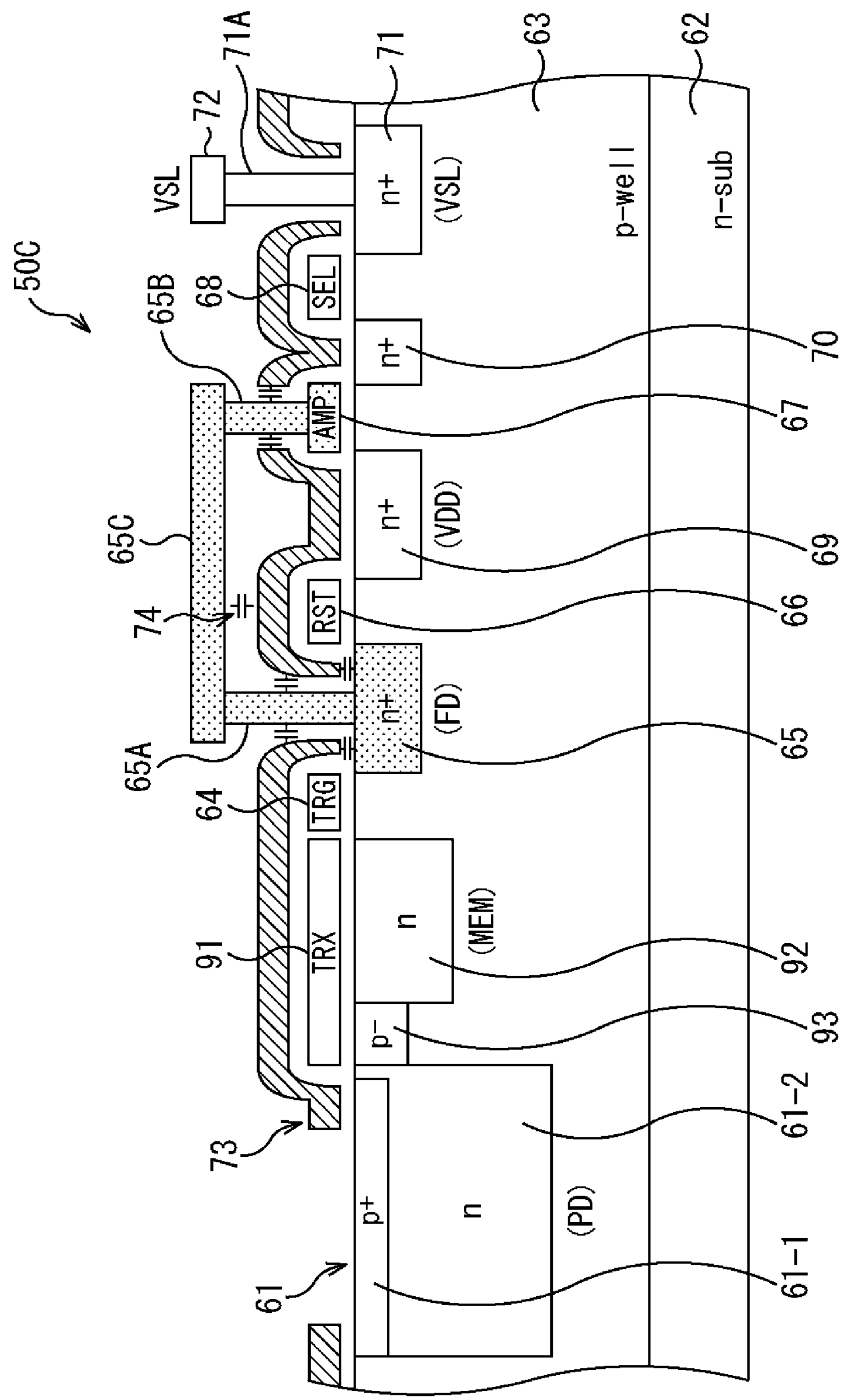
FIG. 9 is a diagram showing another second configuration example of the unit pixel.

FIG. 9 is a diagram showing the structure of a unit pixel 50C as another second configuration example of the unit pixel 50.

The unit pixel 50C of FIG. 9 is different from the unit pixel 50B of FIG. 8 in that an overflow path 93 is formed by providing a p− impurity diffusion region under the gate electrode of the transfer gate 91 and at the boundary part between the photodiode 61 and the memory part 92.

In the unit pixel 50C, the overflow path 93 is used as a part to accumulate a charge generated under low illuminance in the photodiode 61 preferentially.

By providing the p− impurity diffusion region at the boundary part between the photodiode 61 and the memory part 92, the potential of the boundary part is lowered. This part in which the potential is lowered serves as the overflow path 93. A charge that is generated in the photodiode 61 and surpasses the potential of the overflow path 93 automatically leaks to the memory part 92 and is accumulated therein. In other words, the generated charge equal to or lower than the potential of the overflow path 93 is accumulated in the photodiode 61.

Furthermore, the overflow path 93 has a function as an intermediate charge transfer part. Specifically, the overflow path 93 as the intermediate charge transfer part transfers, to the memory part 92, a charge that is generated by photoelectric conversion by the photodiode 61 and surpasses a predetermined charge amount determined by the potential of the overflow path 93 as a signal charge in the exposure period, in which all of plural unit pixels simultaneously carry out imaging operation.

Also in the unit pixel 50C of FIG. 9, the charge accumulated in the memory part 92 is transferred to the floating diffusion region 65 when the drive signal TRG is applied to the gate electrode (not shown) of the transfer gate 64.

That is, also in the unit pixel 50C of FIG. 9, similarly to the unit pixel 50B of FIG. 8, in the case of the first operation, the voltage FD of the floating diffusion region 65 is modulated when the charge accumulated in the memory part 92 is transferred to the floating diffusion region 65 by the transfer gate 64. In the case of the second operation, the voltage FD of the floating diffusion region 65 is modulated after the charge accumulated in the memory part 92 is transferred to the floating diffusion region 65 by the transfer gate 64.

In the example of FIG. 9, the structure in which the overflow path 93 is formed by providing the p− impurity diffusion region is employed. However, it is also possible to employ a structure in which the overflow path 93 is formed by provided an n− impurity diffusion region instead of providing the p− impurity diffusion region.

Another Third Configuration Example of Unit Pixel

Figure 10:
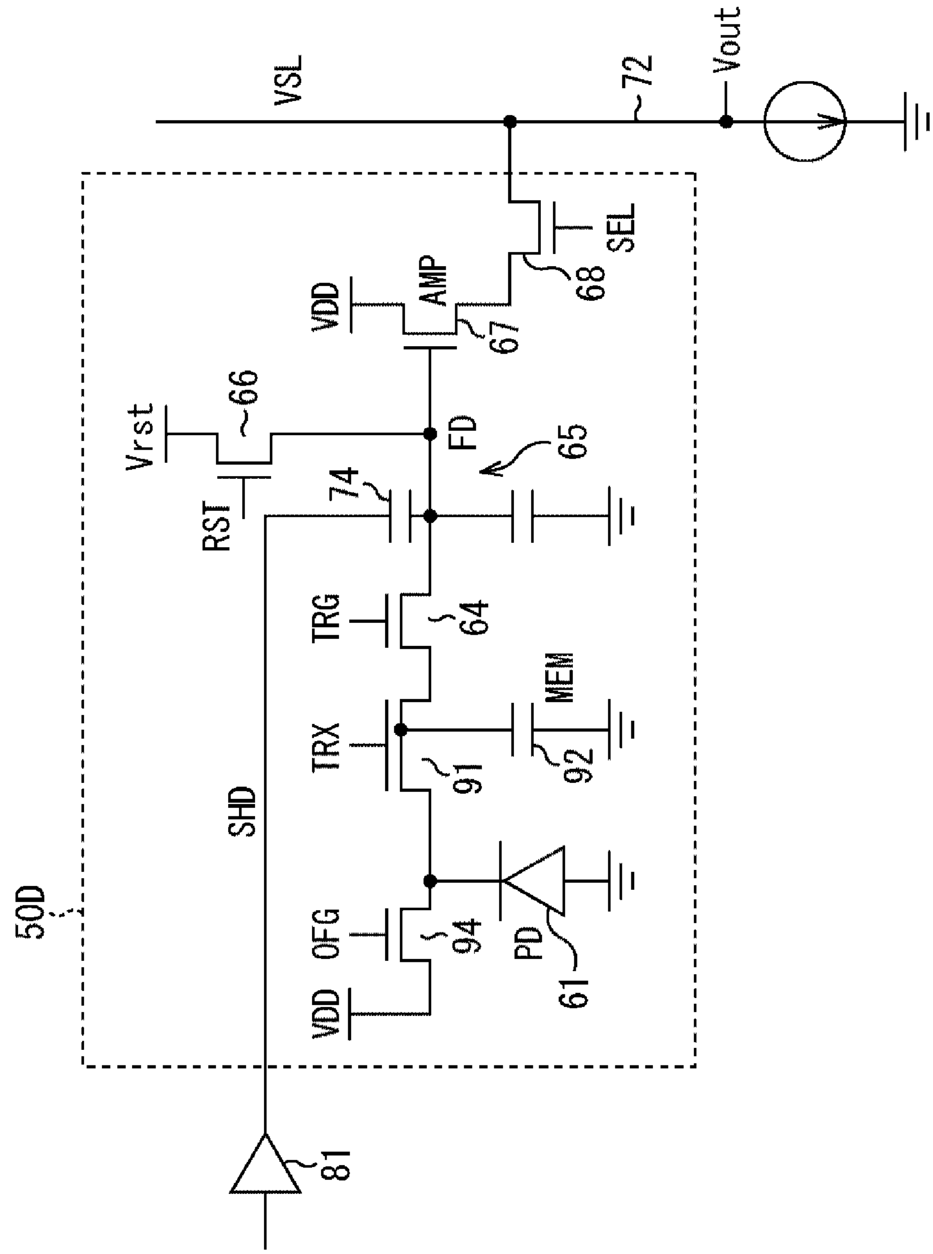
FIG. 10 is a diagram showing another third configuration example of the unit pixel.

In the unit pixel 50C described with FIG. 9, an overflow gate for preventing blooming may be provided. In this case, the unit pixel 50C has e.g. a circuit configuration shown in FIG. 10. In FIG. 10, the part corresponding to that in FIG. 9 is given the same numeral and description thereof is accordingly omitted.

In a unit pixel 50D shown in FIG. 10, an overflow gate 94 formed of e.g. a transistor is provided in addition to the unit pixel 50C shown in FIG. 9. In FIG. 10, the overflow gate 94 is connected between the power supply VDD and the photodiode 61. The overflow gate 94 resets the photodiode 61 when being supplied with a control signal OFG from the vertical driver 42 via the pixel drive line 46. That is, the overflow gate 94 drains the charge accumulated in the photodiode 61.

The overflow gate 94 provided in the unit pixel 50D shown in FIG. 10 may be provided in the unit pixel 50 described with FIG. 2 and the unit pixel 50B described with FIG. 8, of course.

Another Fourth Configuration Example of Unit Pixel

Figure 11:
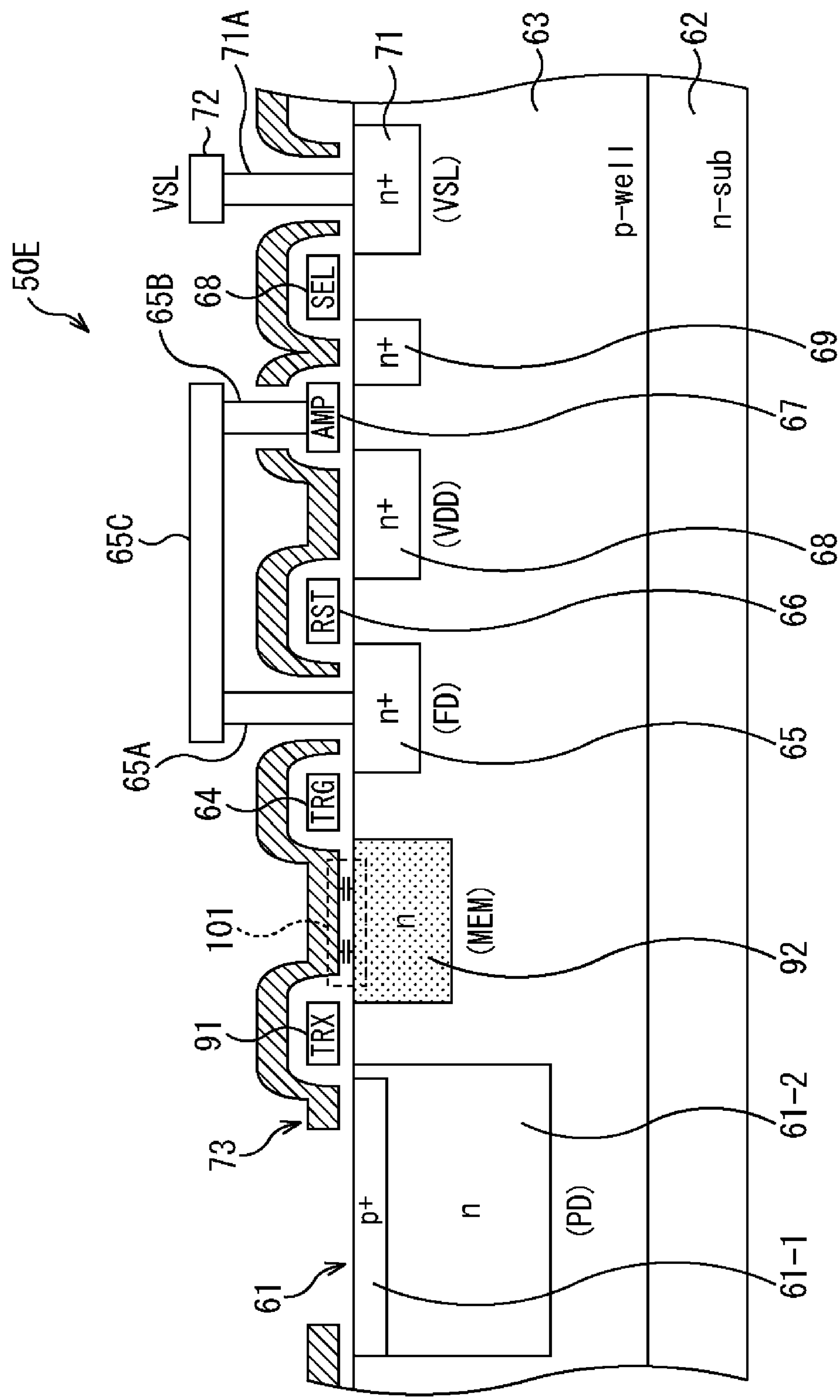
FIG. 11 is a diagram showing another fourth configuration example of the unit pixel.

FIG. 11 is a diagram showing the structure of a unit pixel 50E as another fourth configuration example of the unit pixel 50.

The unit pixel 50E is different from the unit pixel 50B of FIG. 8 in that the light shielding film 73 is capacitively coupled to the Si surface of the memory part 92. Parasitic capacitance 101 generated in this manner is a factor that is dominant over the total capacitance of the memory part 92.

In the unit pixel 50E of FIG. 11, in the case of the first operation, the voltage of the memory part 92 is modulated when the charge accumulated in the photodiode 61 is transferred to the memory part 92 by the transfer gate 91. In the case of the second operation, the voltage of the memory part 92 is modulated after the charge accumulated in the photodiode 61 is transferred to the memory part 92 by the transfer gate 91.

Also in the unit pixels 50B to 50E described with reference to FIGS. 8 to 11, the lower voltage of the light shielding film 73 (light shielding film voltage SHD at the L level) can be set to a negative voltage. This makes it possible to form an inversion layer around the Si surface of the floating diffusion region 65 and the memory part 92 and suppress the occurrence of a dark current generated from a crystal defect around the Si surface and a dot defect.

[Planar Configuration of Unit Pixel]

The planar configuration of the unit pixels configuring the pixel array part 41 of the CMOS image sensor 30 to which the embodiment of the present disclosure is applied will be described below.

Figure 12:
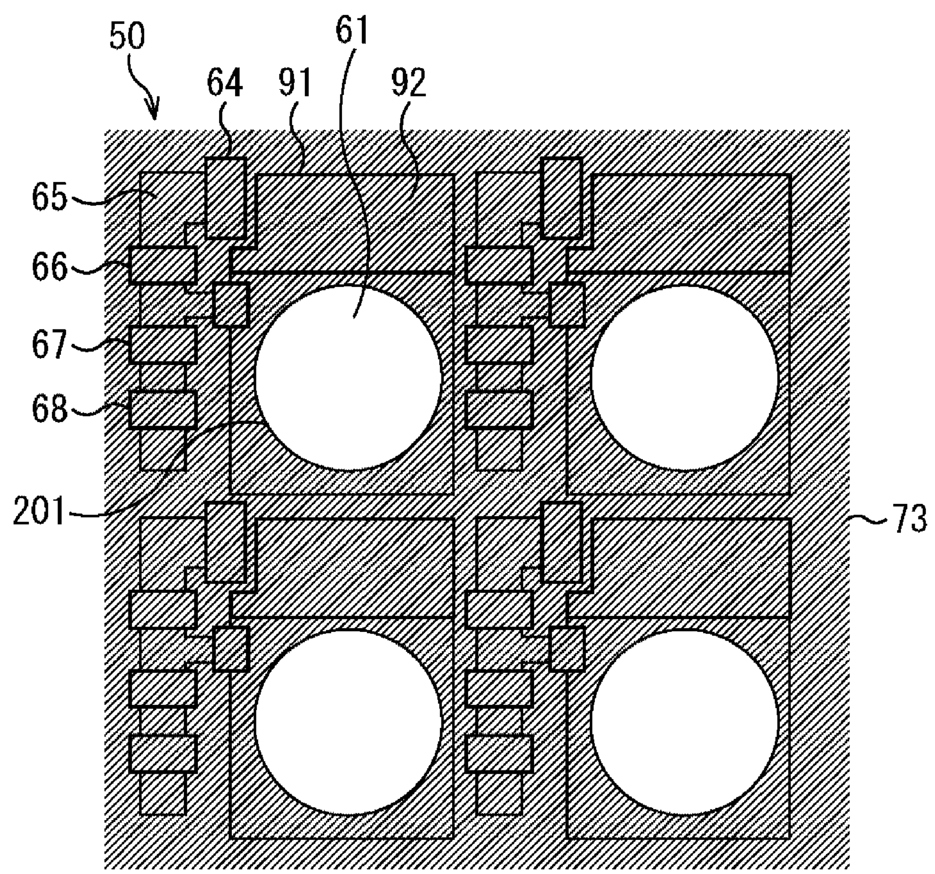
FIG. 12 is a plan view showing a configuration example of the unit pixels.

FIG. 12 is a plan view showing a configuration example of the unit pixels. In FIG. 12, four unit pixels are shown. Each of the unit pixels shown in FIG. 12 corresponds to the unit pixels 50B to 50E (FIGS. 8 to 11) having the transfer gate 91 and the memory part 92 specifically. However, each of these unit pixels corresponds also to the unit pixel 50 of FIG. 2. In FIG. 12, the part corresponding to that in the configurations shown in FIGS. 2 and 8 to 11 is given the same numeral and description thereof is accordingly omitted.

As shown in FIG. 12, apertures 201 are provided at the parts corresponding to the light receiving parts of the photodiodes 61 in the light shielding film 73 that is so formed as to cover the upper surface of the unit pixels 50.

The apertures 201 are so designed as to have the optimum size and position in consideration of the trade-off between the optical sensitivity of the photodiode 61 and noise generated in the floating diffusion region 65 as described above. In FIG. 12, the apertures provided at the parts corresponding to the contacts 65A, 65B, 71A, and so forth are not shown.

In this manner, in the pixel array part 41 of the CMOS image sensor 30, the light shielding film 73 in which the apertures 201 are provided at the parts corresponding to the light receiving parts of the photodiodes 61 of the respective unit pixels 50 configuring the pixel array part 41 is formed.

In the configuration shown in FIG. 12, one light shielding film 73 is formed over the top surface of the respective unit pixels 50 configuring the pixel array part 41. However, it is also possible that the light shielding film 73 is so formed as to be separated along the drive scanning direction in units of one row or plural rows as described above.

For example, if the unit pixels 50 arranged along the horizontal direction in FIG. 12 are regarded as the unit pixels 50 along the drive scanning direction, the light shielding film 73 can be separated along the drive scanning direction at the boundary part that divides four unit pixels 50 shown in FIG. 12 into upper two and lower two.

This allows the light shielding film 73 to be driven on a row-by-row basis. Thus, in the second operation, the voltage FD of the floating diffusion region 65 can be kept at a further lower voltage for only the charge retention period corresponding to the row to be read out in the sequential reading on a row-by-row basis.

Figure 13:
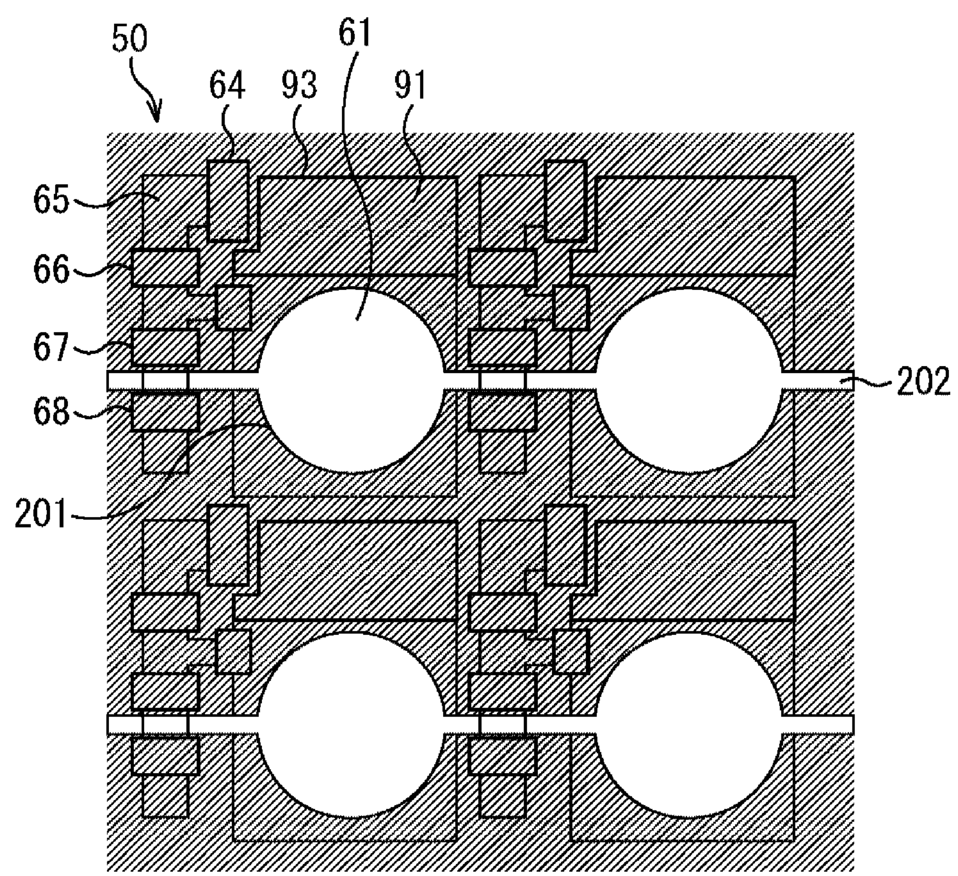
FIG. 13 is a plan view showing a configuration example of the unit pixels.

As shown in FIG. 13, the light shielding film 73 may be separated along the drive scanning direction in such a manner that the apertures 201 are made as part of a boundary 202 at which the light shielding film 73 is separated. This can reduce the region that is not shielded from light over the unit pixels 50 compared with the case in which the apertures 201 are not made as part of the boundary at which the light shielding film 73 is separated. In particular, if the apertures 201 are formed into a circular shape, forming the boundary 202 passing through the diameter of the apertures 201 can minimize the region that is not shielded from light over the unit pixels 50 and further reduce noise generated in the floating diffusion region 65.

Configuration Example of Electronic Apparatus to which Embodiment of the Present Disclosure is Applied The embodiment of the present disclosure is not limited to application to a solid-state imaging element. Specifically, the embodiment of the present disclosure can be applied to the overall electronic apparatus in which a solid-state imaging element is used as an image capturing part (photoelectric conversion part), such as imaging apparatus typified by digital still camera and video camcorder, portable terminal apparatus having an imaging function, and copying machine in which a solid-state imaging element is used as an image reading part. The solid-state imaging element may have a one-chip form or may have a module form that is obtained by packaging an imager, a signal processor, and an optical system collectively and has an imaging function.

Figure 14:
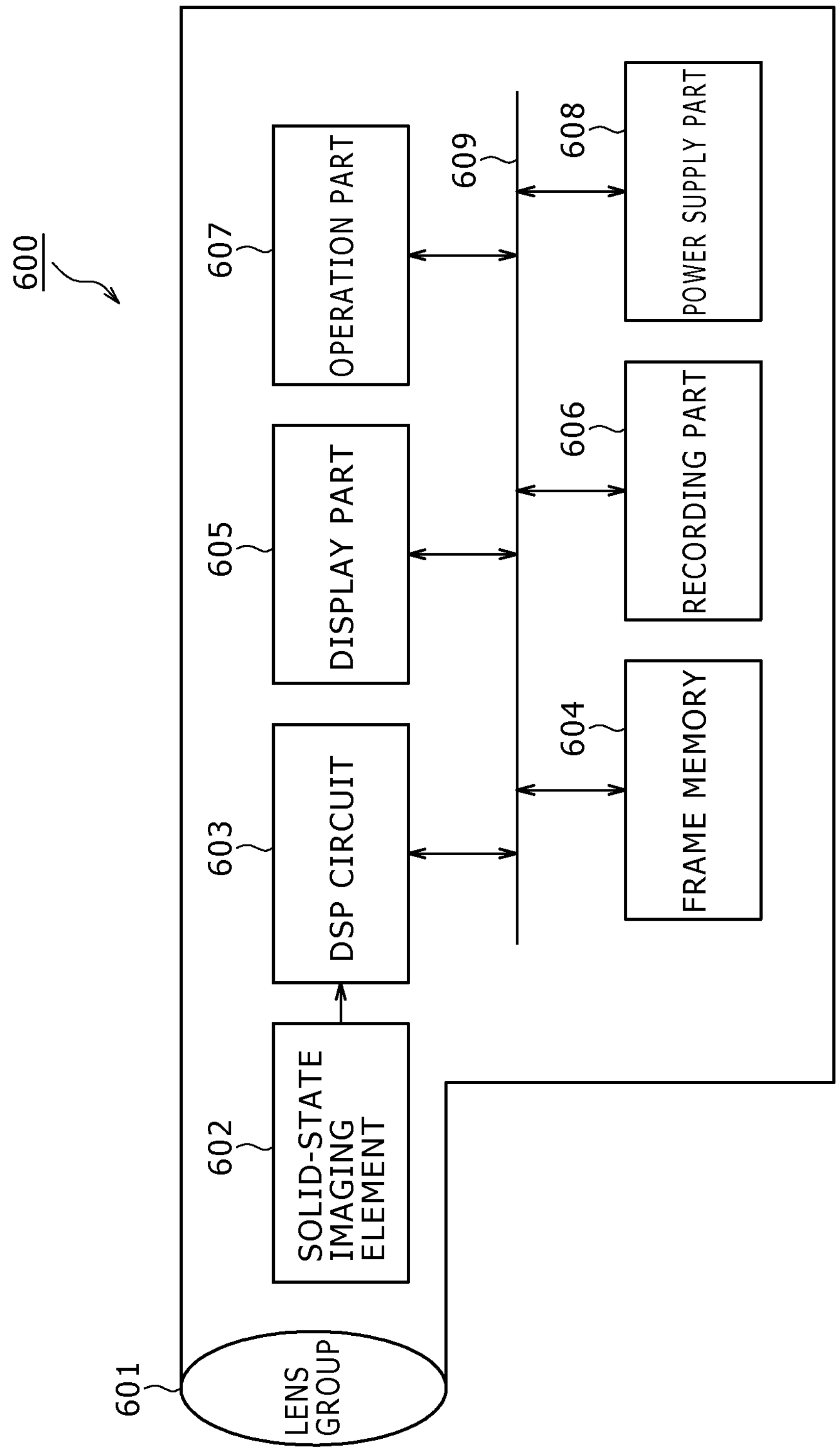
FIG. 14 is a diagram showing a configuration example of electronic apparatus to which one embodiment of the present disclosure is applied.

FIG. 14 is a block diagram showing a configuration example of imaging apparatus as electronic apparatus to which the embodiment of the present disclosure is applied.

Imaging apparatus 600 of FIG. 14 includes an optical part 601 composed of a lens group and so forth, a solid-state imaging element (imaging device) 602 for which any of the respective configurations of the above-described unit pixels 50 is employed, and a DSP circuit 603 as a camera signal processing circuit. Furthermore, the imaging apparatus 600 includes also a frame memory 604, a display part 605, a recording part 606, an operation part 607, and a power supply part 608. The DSP circuit 603, the frame memory 604, the display part 605, the recording part 606, the operation part 607, and the power supply part 608 are connected to each other via a bus line 609.

The optical part 601 captures incident light (image light) from a subject and forms the image on the imaging plane of the solid-state imaging element 602. The solid-state imaging element 602 converts the light amount of the incident light from which the image is formed on the imaging plane by the optical part 601 to an electrical signal on a pixel-by-pixel basis and outputs it as a pixel signal. As this solid-state imaging element 602, a solid-state imaging element such as the CMOS image sensor 30 according to the above-described embodiment, i.e. a solid-state imaging element that can realize imaging without distortion by global exposure, can be used.

The display part 605 is formed of a panel display device such as a liquid crystal panel or an organic electro luminescence (EL) panel and displays a moving image or a still image taken by the solid-state imaging element 602. The recording part 606 records the moving image or the still image taken by the solid-state imaging element 602 in a recording medium such as a video tape or a digital versatile disk (DVD).

The operation part 607 issues an operation command regarding various functions possessed by the imaging apparatus 600 under operation by the user. The power supply part 608 accordingly supplies various kinds of power serving as the operating power of the DSP circuit 603, the frame memory 604, the display part 605, the recording part 606, and the operation part 607 to these supply subjects.

As described above, by using the CMOS image sensor 30 according to the above-described embodiment as the solid-state imaging element 602, the voltage of the charge retaining region can be modulated sufficiently greatly. Therefore, the amount of saturation charge can be increased. In addition, it becomes possible to reduce the residual image and suppress the occurrence of dark current and dot defect. Thus, enhancement in the image quality of the taken image can be achieved in the imaging apparatus 600 such as video camcorder, digital still camera, and camera module for mobile apparatus typified by a cellular phone.

The above-described embodiment is explained by taking as an example the case of application to a CMOS image sensor obtained by disposing unit pixels to sense a signal charge depending on the light amount of visible light as a physical quantity in a matrix manner. However, the embodiment of the present disclosure is not limited to application to the CMOS image sensor and can be applied to the overall solid-state imaging elements of the column system obtained by disposing a column processor for each of the pixel columns of the pixel array part.

Furthermore, the embodiment of the present disclosure is not limited to application to a solid-state imaging element that takes an image by sensing the distribution of the amount of incident light of visible light. The embodiment of the present disclosure can be applied to a solid-state imaging element that takes an image by sensing the distribution of the amount of incidence of infrared, X-ray, or particles and, in a broad sense, the overall solid-state imaging elements (physical quantity distribution detecting devices) such as a fingerprint detecting sensor that takes an image by sensing the distribution of another physical quantity such as pressure or electrostatic capacitance.

Embodiments of the present disclosure are not limited to the above-described embodiment and various changes can be made without departing from the gist of the present disclosure.

The present disclosure contains subject matter related to that disclosed in Japanese Priority Patent Application JP 2010-279508 filed in the Japan Patent Office on Dec. 15, 2010, the entire content of which is hereby incorporated by reference.

What is claimed is:

1. A solid-state imaging element, comprising:

a plurality of pixels, wherein a pixel of the plurality of pixels includes:

a photoelectric conversion part that is configured to generate a charge;

a transfer part configured to transfer the generated charge to a region;

a light shielding film coupled to an interconnect layer such that a first capacitance is generated between the light shielding film and the interconnect layer, wherein the region is connected to the interconnect layer through a contact portion, and wherein the light shielding film is configured to shield, from light, a surface of the pixel except a light receiving part of the photoelectric conversion part; and a voltage controller configured to:

set a voltage that is applied to the light shielding film to a first voltage for a charge accumulation period, wherein the charge is accumulated in the photoelectric conversion part in the charge accumulation period; and change the first voltage of the light shielding film to a second voltage for a charge transfer period, wherein the charge is transferred, by the transfer part, in the charge transfer period, and wherein the second voltage is higher than the first voltage.

2. The solid-state imaging element of claim 1, wherein the light shielding film extends over the plurality of pixels except over light receiving parts of photoelectric conversion parts of the plurality of pixels.

3. The solid-state imaging element of claim 1, further comprising a pixel array part, wherein the plurality of pixels are arranged, in a matrix, in the pixel array part, wherein the transfer part is further configured to transfer, the charge collectively for a plurality of rows in the pixel array part, to the region, and wherein the voltage controller is further configured to set the voltage that is applied to the light shielding film collectively for the plurality of rows of the pixel array part.

4. The solid-state imaging element of claim 1, wherein the first voltage is a negative voltage.

5. The solid-state imaging element according to claim 1, further comprising a pixel array part, wherein the plurality of pixels are arranged in a matrix in the pixel array part, and wherein the light shielding film is separated into units of a plurality of rows of the pixel array part.

6. The solid-state imaging element according to claim 5, wherein the light shielding film comprises a plurality of apertures for light receiving parts, and wherein the light shielding film is separated into the units of the plurality of rows such that the plurality of apertures are part of a boundary of the units.

7. The solid-state imaging element of claim 5, further comprising a drive circuit for the transfer part, wherein the drive circuit is configured to apply the voltage to the light shielding film, and wherein the light shielding film is separated into the units of the plurality of rows.

8. The solid-state imaging element according to claim 1, wherein the region is a floating diffusion, and wherein the transfer part is further configured to transfer the charge from the photoelectric conversion part to the floating diffusion.

9. The solid-state imaging element according to claim 1, wherein the region is a floating diffusion, and wherein the transfer part is further configured to transfer the charge from a charge retaining part to the floating diffusion.

10. The solid-state imaging element of claim 1, further comprising a memory part configured to accumulate the charge, wherein the transfer part is further configured to transfer the accumulated charge from the memory part to the region, and wherein the region is a floating diffusion.

11. The solid-state imaging element of claim 10, wherein the memory part is between the transfer part and the photoelectric conversion part.

12. The solid-state imaging element of claim 1, wherein the interconnect layer comprises an interconnect that connects a floating diffusion and an amplification transistor.

13. The solid-state imaging element of claim 1, further comprising: an amplification transistor connected to the region through the interconnect layer in the pixel; and a selection transistor connected to the amplification transistor.

14. The solid-state imaging element of claim 1, wherein the generated first capacitance between the light shielding film and the interconnect layer is greater than a second capacitance of the region.

15. A method, the method comprising: in a solid-state imaging element that comprises: a voltage controller; and a plurality of pixels, wherein a pixel of the plurality of pixels comprises: a photoelectric conversion part and a transfer part; and a light shielding film coupled to an interconnect layer such that a first capacitance is generated between the light shielding film and the interconnect layer, wherein the light shielding film is configured to shield, from light, a surface of the pixel except a light receiving part of the photoelectric conversion part; transferring, by the transfer part, a charge generated by the photoelectric conversion part to a region, wherein the region is connected to the interconnect layer through a contact portion; setting, by the voltage controller, a voltage that is applied to the light shielding film to a first voltage for a charge accumulation period, wherein the charge is accumulated in the photoelectric conversion part in the charge accumulation period; and changing the first voltage of the light shielding film to a second voltage for a charge transfer period, wherein the charge is transferred, by the transfer part, in the charge transfer period, and wherein the second voltage is higher than the first voltage.

16. The method of claim 15, wherein the light shielding film extends over the plurality of pixels except over light receiving parts of photoelectric conversion parts of the plurality of pixels.

17. The method of claim 15, further comprising: transferring the charge collectively for a plurality of rows of a pixel array part, wherein the plurality of pixels are arranged in a matrix in the pixel array part; and setting the voltage that is applied to the light shielding film collectively for the plurality of rows of the pixel array part.

18. The method of claim 15, wherein the first voltage is a negative voltage.

19. The method of claim 15, further comprising: applying, by a drive circuit, the voltage to the light shielding film, wherein the transfer part comprises the drive circuit.

20. An electronic apparatus, comprising: a solid-state imaging element that comprises: a plurality of pixels, wherein a pixel of the plurality of pixels includes: a photoelectric conversion part that is configured to generate a charge; a transfer part configured to transfer the generated charge to a region; a light shielding film coupled to an interconnect layer such that a first capacitance is generated between the light shielding film and the interconnect layer, wherein the region is connected to the interconnect layer through a contact portion, and wherein the light shielding film is configured to shield, from light, a surface of the pixel except a light receiving part of the photoelectric conversion part; and a voltage controller configured to: set a voltage that is applied to the light shielding film to a first voltage for a charge accumulation period, wherein the charge is accumulated in the photoelectric conversion part in the charge accumulation period; and change the first voltage of the light shielding film to a second voltage for a charge transfer period, wherein the charge is transferred, by the transfer part, in the charge transfer period, and wherein the second voltage is higher than the first voltage.

* * * * *